(12) United States Patent
Du et al.

(10) Patent No.: US 6,324,190 B1
(45) Date of Patent: Nov. 27, 2001

(54) DEVICE WITH AT LEAST ONE BEAM SOURCE AND AN ARRANGEMENT FOR GEOMETRIC RESHAPING OF THE RADIATION FIELD EMITTED BY THE BEAM SOURCE

(75) Inventors: Keming Du; Peter Loosen, both of Aachen (DE)

(73) Assignee: Fraunhofer-Gesellschaft zur Foerderung der Angewandten Forschung, E.V., Munich (DE)

(*) Notice: Subject to any disclaimer, the term of this patent is extended or adjusted under 35 U.S.C. 154(b) by 0 days.

(21) Appl. No.: 09/242,393
(22) PCT Filed: Aug. 13, 1997
(86) PCT No.: PCT/EP97/04431
§ 371 Date: Feb. 16, 1999
§ 102(e) Date: Feb. 16, 1999
(87) PCT Pub. No.: WO98/08128
PCT Pub. Date: Feb. 26, 1998

(30) Foreign Application Priority Data

Aug. 16, 1996 (DE) .............................................. 196 33 132

(51) Int. Cl.[7] ....................................................... H01S 3/10
(52) U.S. Cl. ..................................................... 372/9; 372/8
(58) Field of Search .............................. 372/9, 8, 99, 100, 372/106, 107; 359/628

(56) References Cited

U.S. PATENT DOCUMENTS 5,592,333 * 1/1997 Lewis ................................... 359/628

* cited by examiner

Primary Examiner—Leon Scott, Jr.
(74) Attorney, Agent, or Firm—Milde, Hoffberg & Macklin, LLP

(57) ABSTRACT

An arrangement is disclosed for geometrically shaping a radiation field, in particular the radiation field of a diode laser array which propagates in the z direction and has a radiation cross section which is larger, in a direction defined as the y direction, which is perpendicular to the first, and has a lower radiation quality in said direction. X, y and z form a Cartesian coordinate system. The radiation is grouped into radiation fractions in the x direction and the radiation fractions are reoriented as regards their radiation cross sections. The arrangement has at least two reflective elements (6) and is characterized in that each reflective element has a pair of reflection surfaces (7,8) at approximately or exactly 90° to each other. This opening angle (9) is oriented against the direction of propagation. The line (10) at which the reflection surfaces intersect is oriented at approximately below 45° to the x direction.

4 Claims, 7 Drawing Sheets

DEVICE WITH AT LEAST ONE BEAM SOURCE AND AN ARRANGEMENT FOR GEOMETRIC RESHAPING OF THE RADIATION FIELD EMITTED BY THE BEAM SOURCE

BACKGROUND OF THE INVENTION

The present invention has to do with an arrangement for geometric reshaping of a radiation field, especially a radiation field of a diode laser array. This field propagates in a z-direction. It has a radiation cross section, which in one direction defined as the x-direction, runs perpendicular to the z-direction, a direction which is perpendicular to it, defined as the y-direction, exhibiting a greater propagation with lower beam quality. In this case, x, y and z form a rectangular (Cartesian) coordinate system, whereby the radiation is or will be grouped into radiation components in the x-direction. The radiation components, in relation to their beam cross sections, are reoriented. This arrangement includes at least two reflectors.

Such an arrangement is generally known.

There are several areas in such arrangements as are presented above are applied. Among other things, they include geometric reshaping of diode laser outputs, in order to build up defined radiation fields. Additionally, the applications include reshaping of a rectangular radiation field of a laser with an amplification medium having such shapes as slabs or rods. This is done in order to homogenize the beam quality over the cross section of the beam, and to adapt it to specific applications.

High-performance diode laser arrays or field arrangements typically have active media with a cross section of 1 μm×10 mm. Because of this, the diode laser radiation is characterized, among other things, by a typically elliptical beam cross section and a large divergence angle in the fast relatively small divergence in the slow direction (parallel to the PN transition).

Such a diode laser array with a beam cross section of 1 μm × 10 mm possesses extremely varied beam qualities in the two directions parallel and perpendicular to the PN transition. The beam quality in the fast direction is diffraction limited, an ca. 1000 to 2000 times as diffraction limited in the slow direction. For this reason, radiation emitted from a diode laser array cannot be focused by cylindrical and spherical lenses onto a small and circular spot. For this reason, applications of high-performance diode lasers to individual areas are limited, where only small intensities per surface unit are necessary. Expansion of applications to areas such as medical technology and materials processing, fiber coupling and end-on pumping of solid state lasers and fiber lasers, require that the beam quality be homogenized in both directions.

SUMMARY OF THE INVENTION

Proceeding from the previously indicated state of the art and the problem described above that is posed when using diode laser radiation, the objective of the present invention is to configure an arrangement of the type described above so that the beam quality perpendicular to the propagation direction is homogeneous.

The objective is achieved by an arrangement with the features indicated at the outset. Each reflector exhibits a pair of reflection surfaces, which are approximately 90° or exactly 90° to each other. This opening angle is directed against the propagation direction. Its line of intersection is oriented approximately at 45° to the x-direction.

With such an arrangement, the radiation field of diode laser arrays can be grouped by projecting individual emitter groups. The radiation field is directed at the arrangement with at least two reflectors. Each of the individual reflection surfaces is oriented in paired fashion at 90° to the other, and the radiation is guided at 45° onto the mirror surfaces. Therefore, each part of the radiation is double-reflected in each instance on the reflection surfaces assigned in pairs, and is rotated by a defined angle, preferably 90°. By this means, the beam components or groups are oriented in a direction perpendicular to the original grouping. In other words, the groups which initially were grouped in the X-direction, now stand above the other as individual sections in the y-direction after the double refection at the pair of reflection surface of the reflectors. Thus, the individual radiation components are geometrically reshaped and reoriented. This permits the beam quality to be homogenized over the cross section. The line of intersection of the two reflection surfaces, forming a pair, of each reflector, can be oriented at an angle not equal to 90° to the z-direction, so that no polarization beam splitter is needed.

In another preferred embodiment of the arrangement, the intersection line of a pair of reflection surfaces assigned to each other of a reflector is oriented at a 90° angle to the z-direction. Seen in the beam propagation direction, the radiation first impinges on a polarization splitter. After retroflection by the pair of reflection surfaces, it is brought back with a rotated polarization direction to the polarization splitter and is there decoupled.

Several reflectors can be fitted to each other for reshaping the radiation of a radiation field. A continuing w-shaped arrangement of reflection surfaces is thus produced. The reflection surfaces are oriented to each other alternately at an angle of 90°. The radiation components of the radiation field which inking on such an arrangement are grouped via the intersection lines of the immediately adjacent reflection surfaces of each two adjacent pairs of reflection surfaces.

It is obvious that the radiation field which is reoriented by the invention-specific arrangement can be composed from the radiation components of several radiation sources. The individual radiation sources or radiation components are then projected onto each pair of surfaces for grouping by means of a projection lens. This is done in such a way that then a pair of reflection surfaces is assigned to each radiation component. At the mirror surfaces of a pair of reflection surfaces, the radiation is subjected to double reflection. Each radiation component is rotated, in order of turn this radiation component in its position in relation to a plane of observation on the starting side of the second reflection surface, i.e., after the second reflection.

With the preferred embodiments, the individual radiation and beam components have large divergence angles. This is advantageous, for a lens is assigned to each of the radiation components reflected by a pair of reflection surfaces. This lens enlarges the dimension of the beam cross section in the y-direction or the direction of higher beam quality, and reduces the divergence angle in this direction.

For a full understanding of the present invention, reference should now be made to the following detailed description of the preferred embodiments of the invention as illustrated in the accompanying drawings.

DESCRIPTION OF THE PREFERRED EMBODIMENTS

Figure 1D:
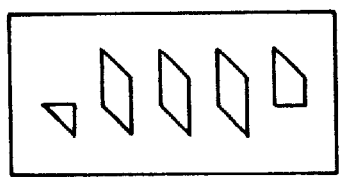
FIGS. 1C and 1D show two observation planes, before and after reflection. The mirror array groups and reshapes the particular radiation groups, respectively.

The present invention will now be described with reference to FIGS. 1–7 of the drawings. Identical elements in the various figures are identified by the same reference numerals.

Figure 1C:
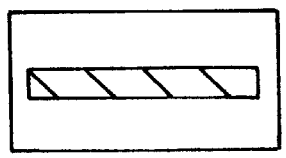
Figure 1A:
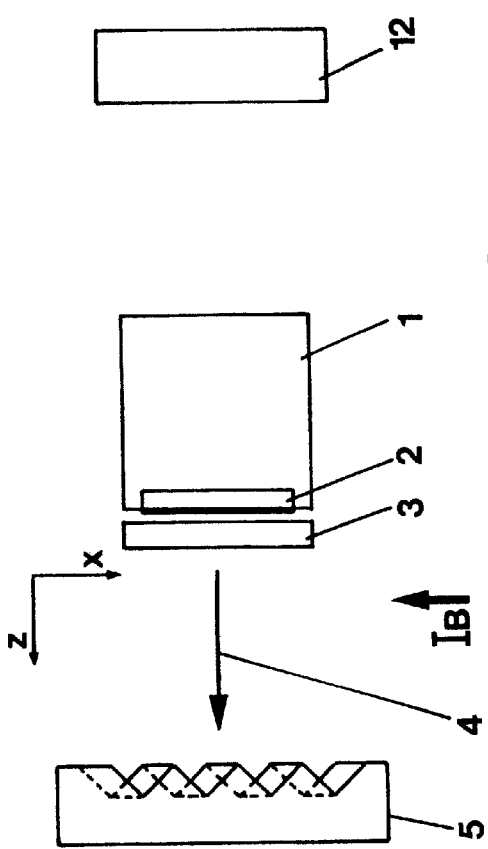
FIG. 1A: is a schematic view of an arrangement for reshaping of diode laser radiation, in which a mirror array, as shown in FIG. 2A, is used.
Figure 1B:
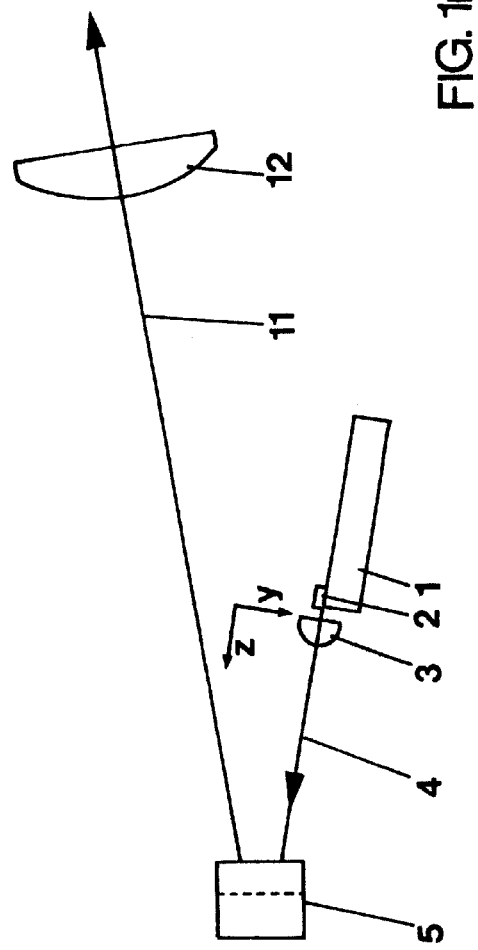
FIG. 1B: is a side view from the direction of viewing arrow IB in FIG. 1A of the mirror array, the diode laser beam source and a collimation device.

FIGS. 1A and 1B show an arrangement for reshaping a radiation field. The radiation source 1 is a linear field arrangement with individual diode laser emitters 2 which form a (linear) field that extends in the x-direction. The radiation scatters in the z-direction. The slow direction of diode laser radiation, i.e., the direction of the elliptical beam cross section with a relatively small divergence angle (parallel to the PN transition) is oriented in the x-direction. The fast direction, i.e., the direction of the elliptical beam cross section with a great divergence angle, is oriented in the y-direction (see FIG. 1B). The x-, y- and z-directions here form a rectangular coordinate system. First the diode laser radiation is collimated by a collimation lens 3, and the divergence angle in this direction is reduced. Then, as indicated by the radiation arrow 4, the diode laser radiation is directed at a small angle, i.e., at an angle in the area of about 10 degrees (as also can be seen in FIG. 1B) to a mirror arrangement 5. As shown in an enlarged depiction in FIG. 2A and an over-head view from the direction of sighting arrow IIB in FIG. 2B, this mirror arrangement 5 includes a number of reflectors. In the embodiment form shown, there is a total of four such reflectors 6, of which each is formed from a pair of reflective surfaces 7, 8. The two reflection surfaces 7, 8 of each reflector 6 form a angle of approximately 90°. This opening angle 9 is directed toward the propagation direction 4 of diode laser radiation. The particular lines of intersection of the pairs of reflection surfaces are set at an angle of about 45° to the x-direction. This produces a w-shaped, continuing array of reflection surfaces 7, 8. The radiation 4 that propagates to the mirror arrangement 5 is grouped into individual radiation components. This takes place at the outer edges, i.e., the intersection lines 10 which jut out toward the laser diode arrangement 1, as depicted in FIG. 1C. With a penetrating or continuing radiation field, beam components are produced. These have a radiation cross section that is rhomboid-shaped transverse to the direction of propagation. Then, from the one reflection surface 7 or 8, the particular radiation component is reflected to the opposite reflection surface 8 or 7, and scattered from there. Each beam component 11 which is emitted from mirror arrangement 5 is then collimated in the slow direction. For this purpose, a collimation lens 12 is placed in the arrangement depicted in FIGS. 1A and 1B.

Figure 3C:
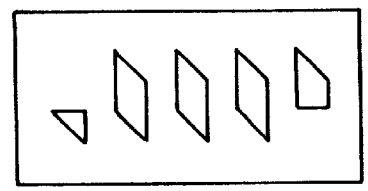
FIG. 3C shows the radiation grouping in an observation plane after double reflection at the mirror array.
Figure 3B:
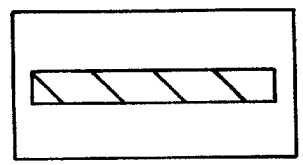
FIG. 3B shows the grouping of the radiation field after grouping on the mirror array as shown in FIG. 3A.
Figure 3A:
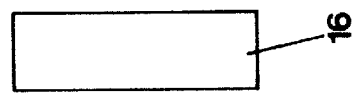
FIG. 3A: is a schematic view of an arrangement for on-axis reshaping of polarized, or at least quasi-polarized, radiation.
Figure 3A:
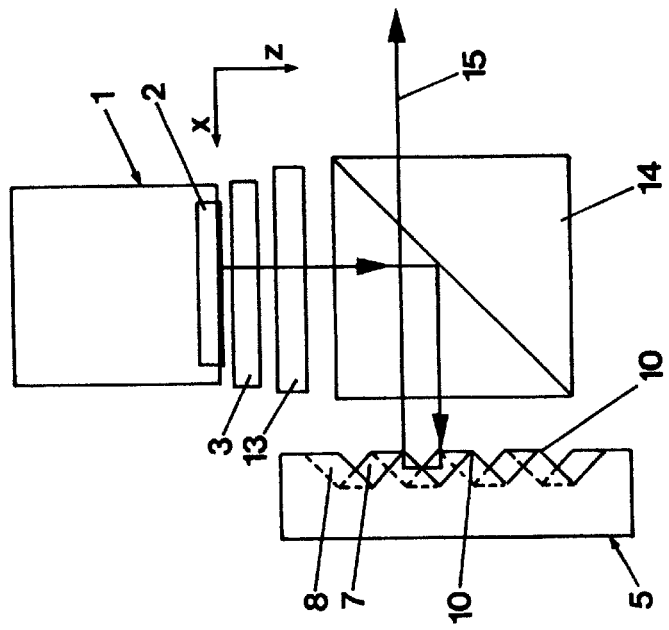

An on-axis reshaping device, i.e., a device in which the edges 10 are perpendicular to the z-direction, is depicted in FIG. 3A. A prerequisite in this arrangement is that the radiation to be reshaped be polarized, or at least quasi-polarized. This condition is met in such arrangements as a diode laser array 1, as is also used in the FIG. 1A embodiment form.

The components and elements depicted and explained in FIG. 3A and later figures are comparable to those in FIGS. 1A and 1B. They therefore make use of the same reference designators. No repetition is given of the description of such components or elements.

Figure 2B:
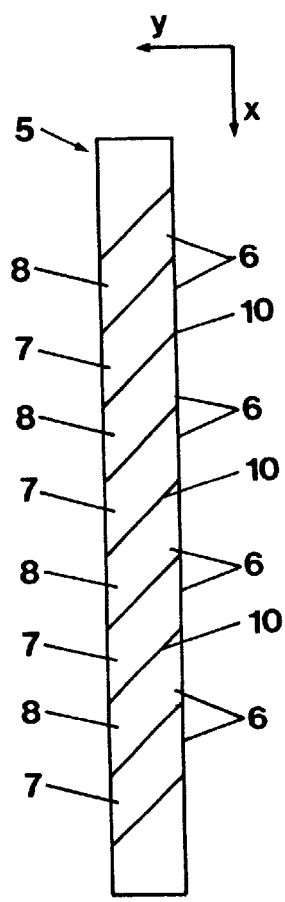
FIG. 2B is a top view of the mirror array of FIG. 2A, from the direction of viewing arrow IIB.
Figure 2A:
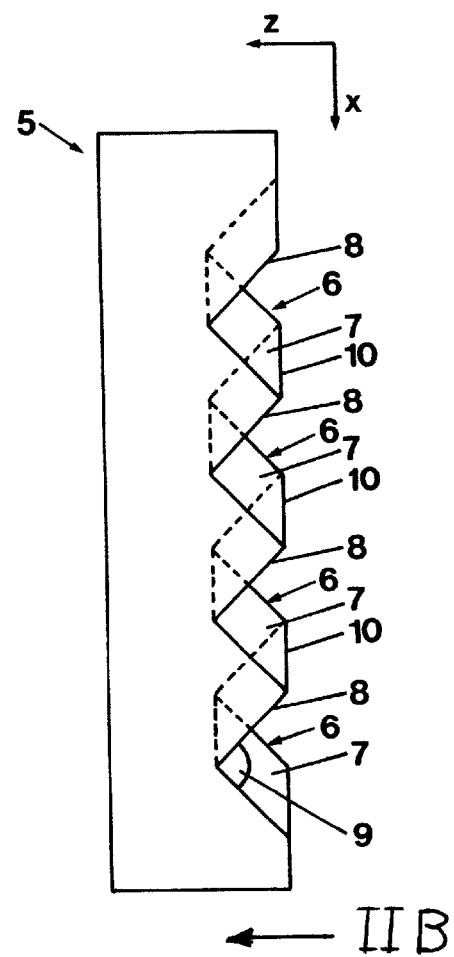
FIG. 2A: is a view of a mirror array which is an essential component of the invention-specific array.

The radiation from diode laser array 1 or of diode laser emitter 2 is collimated by a collimation lens in this embodiment form in the fast direction, thus reducing the divergence angle. The diode laser radiation is then passed through a λ/2 plate 13, which converts the p-polarization of the diode radiation into an s-polarization. The radiation then impinges on the polarizer 14. This guides the diode radiation to mirror arrangement 5, which corresponds with mirror arrangement 5 as depicted in FIGS. 2A and 2B. On the exterior edges 10 of a w-shaped reflector 6 and its reflection surfaces 7, 8, the radiation field is grouped as depicted in FIG. 3B so that rhomboid-shaped radiation groups are produced. The beam components are reflected twice on the particular pair of reflection surfaces 7, 8, resulting in rotation by 9° both with regard to their cross section and polarization. This produces a radiation pattern from the individual radiation cross sections such as that shown in FIG. 3C. The radiation, or the radiation groups, are then decoupled by polarizer 14, as indicated by arrow 15. The radiation emitted from polarizer 14 can be shaped by additional optical arrays 16. Whereby appropriately a collimation of the radiation in the slow direction results.

In the embodiment forms discussed previously using FIGS. 1 to 3, the radiation field is grouped by means of the outer edges of reflectors 6 of mirror arrangement 5. As a result of that, the beam components are rhomboid-shaped, as can be seen using FIGS. 1C and 1D, as well as 3B and 3C. This in fact does represent a Simple procedure for grouping. However, an approximately rectangular or square cross section is required as an ideal, reshaped radiation cross section.

One arrangement by which the requirement for a rectangular or square cross section can be met is depicted in FIG.

Figure 4C:
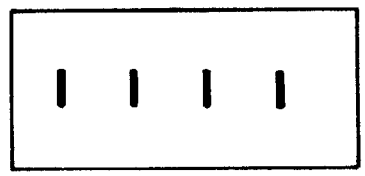
FIG. 4C shows the reorientation of radiation cross sections of radiation groups after double reflection at the mirror array.
Figure 4B:
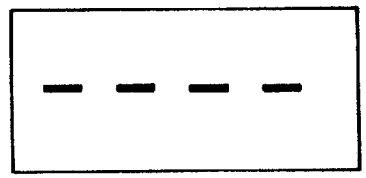
FIG. 4B shows the imaging of radiation groups onto the mirror array.
Figure 4A:
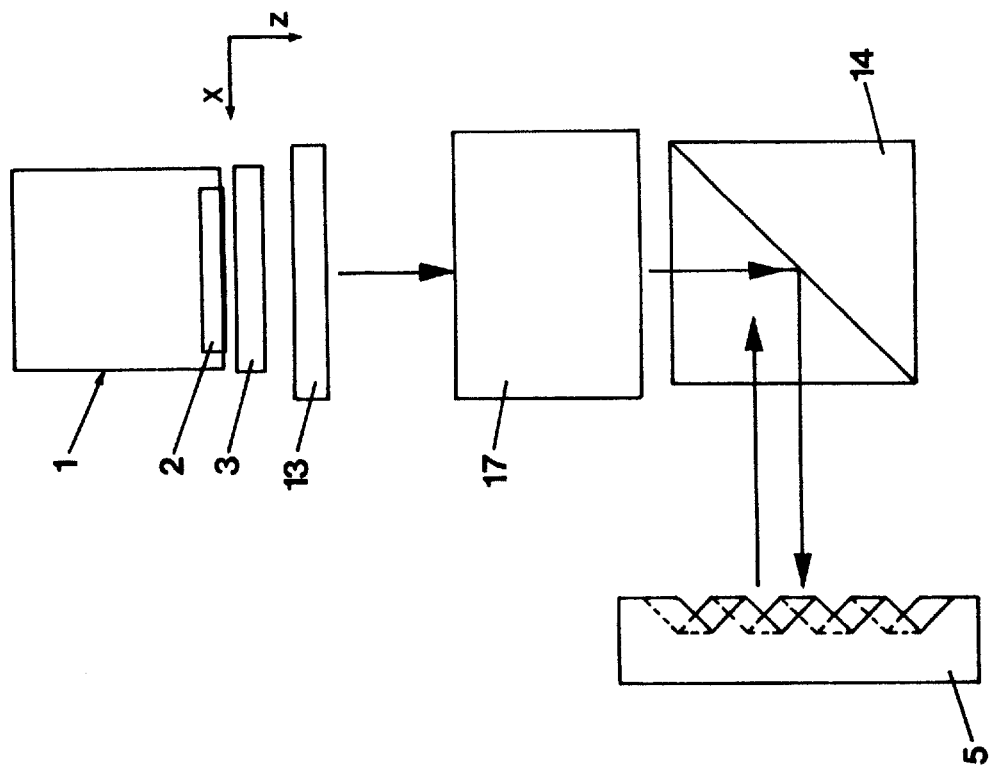
FIG. 4A: is a schematic view of a further array, which is comparable to the array of FIG. 3A, showing an additional imaging lens.

4A. In its fundamental design, it matches the arrangement of FIG. 3A. Additionally, between λ/2 plate 13 and polarizer 14, a focusing lens 17 is inserted which focuses the radiation of diode laser emitter 2, or the radiation groups formed from the radiation of diode laser emitter 2 in the width direction, i.e., in the x-direction of FIG. 4A, onto the particular reflectors 6 or the reflection surfaces 7, 8, as is shown in FIG. 4B. The four roughly rectangular radiation cross sections are assigned to the four reflectors 6 of mirror arrangement 5. After double reflection on the particular reflective surfaces 7, 8, the beam cross sections have been rotated. Then the radiation field which leaves polarizer 14 has an orientation that is rotated vis-a-vis FIG. 4B, as shown in FIG. 4C. The individual radiation cross sections are then stacked one on top of the other. They can then be shifted together by additional focusing lenses so that, lying one atop the other, they form a closed radiation field.

In all the embodiment forms that have been discussed previously, the reflectors 6 of mirror arrangement 5 can also be replaced by individual pentaprisms, which can be combined into an appropriate field.

Figure 5C:
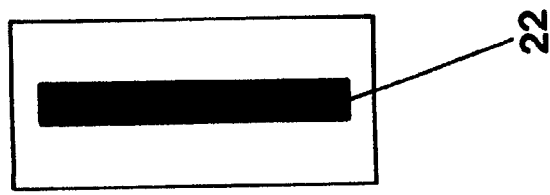
FIG. 5C shows the output-side radiation field of the array from FIG. 5A.

The radiation, or the cross sections of radiation groups, can be reshaped both with and without a focusing lens. When this reshaping takes place, it can be advantageous to keep the dimensions of the radiation field smaller in the direction perpendicular to the grouping. The result of this is that the filling factor of the output radiation field is significantly less than 1, as can be gleaned directly from FIGS. 1D, 3C and 4C. The consequence of this is that beam quality is lessened. To eliminate this disadvantageous effect, it is advantageous to have additional optical focusing arrays by which the filling factor will be increased. Three possible, preferred embodiment forms of such arrays are depicted in FIGS. 5, 6 and 7.

Figure 5A:
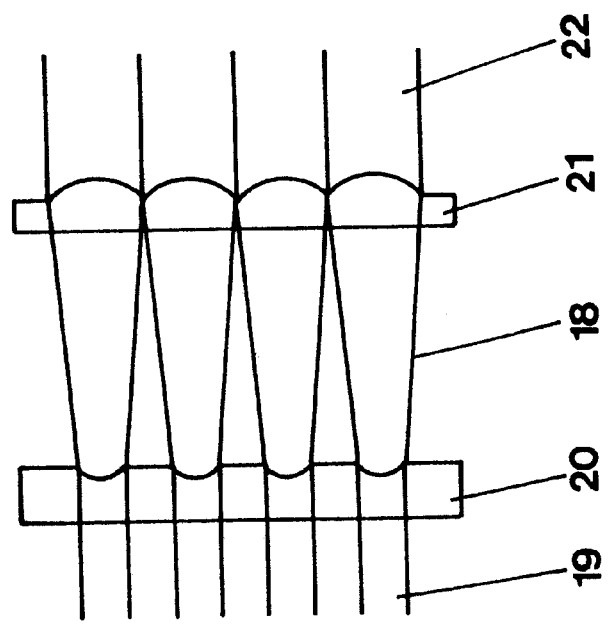
FIG. 5A: is a schematic view of a array which serves to increase the filling factor.
Figure 5B:
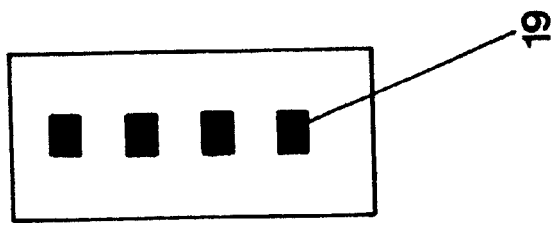
FIG. 5B shows the input radiation field.

The embodiment form depicted in FIG. 5A shows a cylindrical telescopic array 18, in which the individual input-side radiation components 19 (see FIG. 5) are expanded using negative cylindrical lenses 20. They then are made parallel in a positive cylindrical lens 21 assigned to each radiation group. From the individual output radiation components 22, a closed, connected radiation field is produced with a filling factor of 1, as shown in FIG. 5C.

Figure 6A:
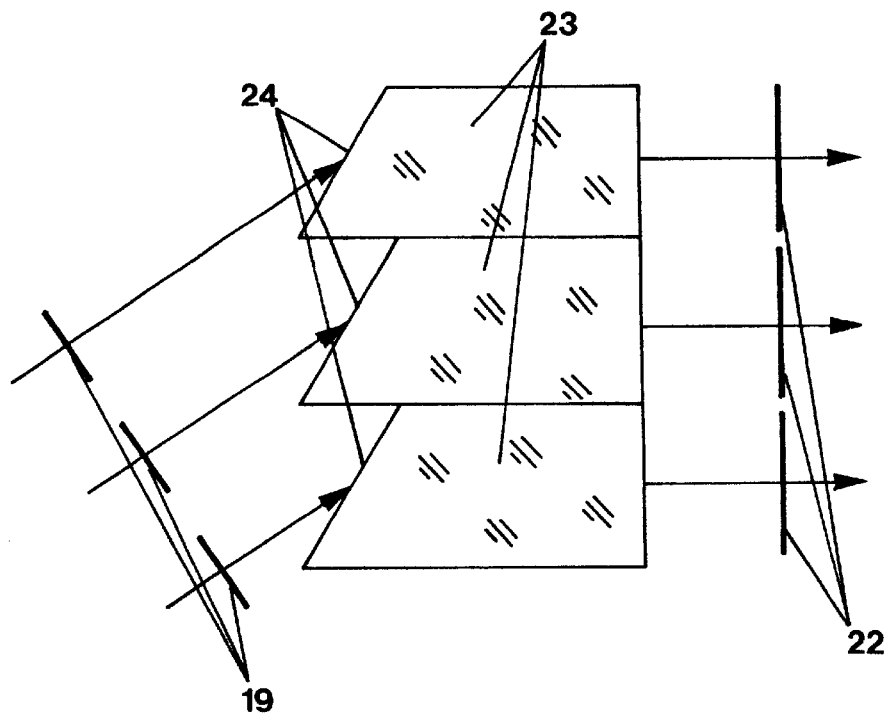
FIG. 6A: is a schematic view of a second array in which the filling factor can be increased with the input and output laser radiation fields shown in FIG. 6B.
Figure 6B:
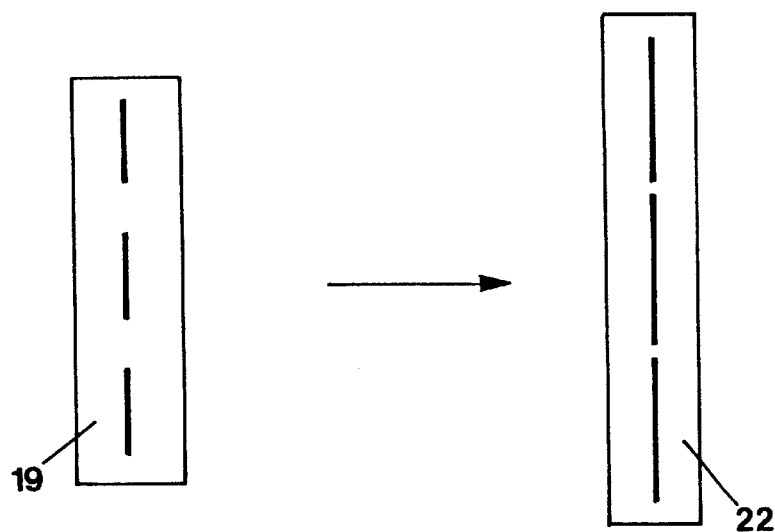

A second preferred array is depicted as an example of FIG. 6A. Three radiation groups are formed in this array, and the particular input-side radiation components 19 are beamed in at an angle into each of three refractors 23, whose entry surfaces 24 are slanted. This is done in such a way that the entire entry surface 24 is illuminated. On the output side of the refractors 23, the cross sections of the individual output radiation components 22 are expanded and shifted closer together, so that a filling factor of approximately 1 is attained. This is also made clear by a comparison of the input radiation components 19 with the output radiation components 22 in FIG. 6.

Figure 7:
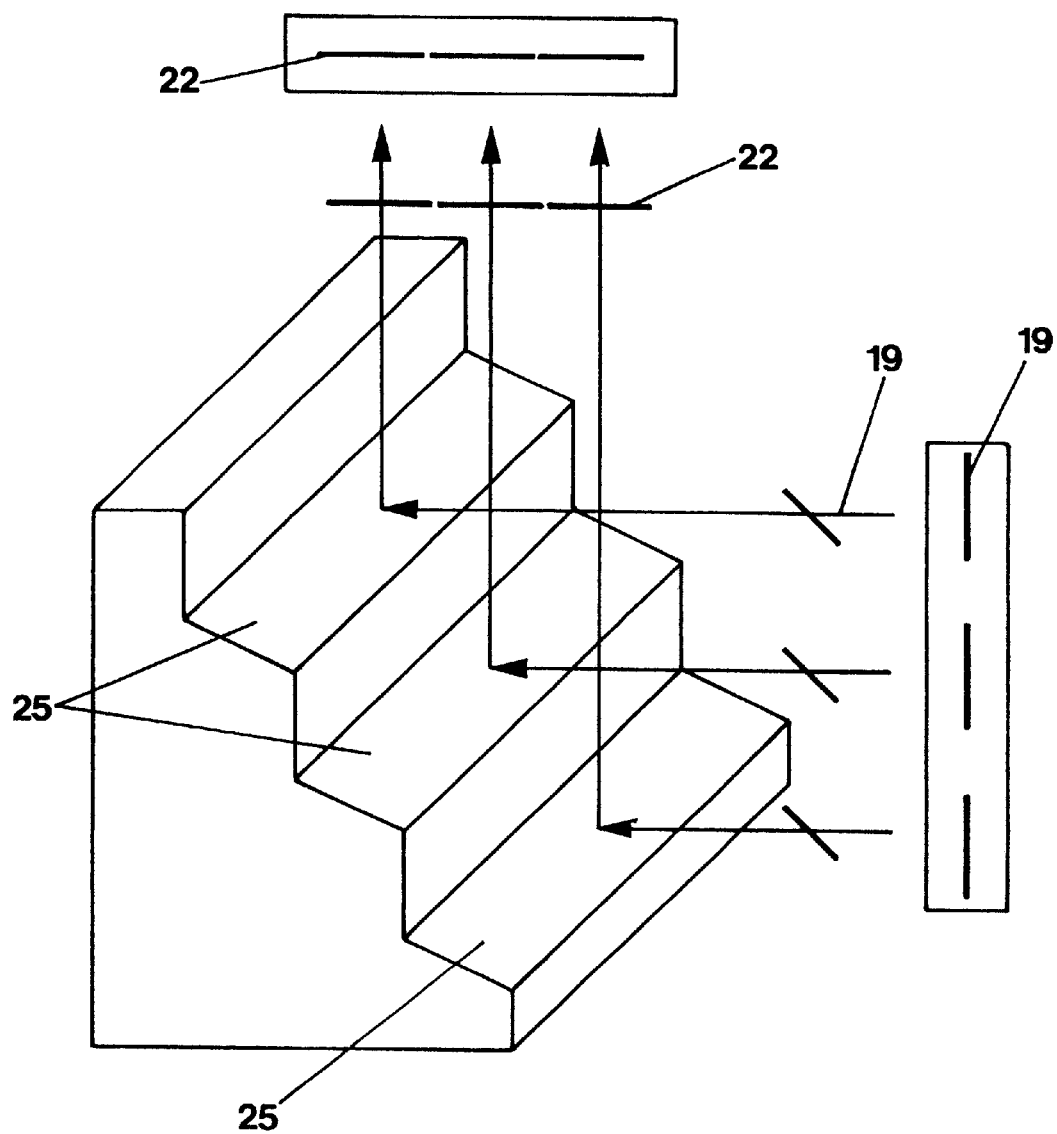
FIG. 7: is a schematic view of a third array which can also increase the filling factor.

Finally, FIG. 7 shows a third embodiment form to increase the filling factor. In contrast to the embodiment form FIG. 6, it employs reflectors. The individual radiation components 19 impinge at a slant on each reflection surface 25. The individual radiation cross sections of the output radiation components 22 are shifted closer together, so that a greater filling factor can be achieved. In relation to the input radiation components 19, the particular coordinates are changed by reflection surfaces 25 in accordance with the desired output-side radiation field.

There has thus been shown and described a novel arrangement for geometrically shaping a radiation field which fulfills all the objects and advantages sought therefor. Many changes, modifications, variations and other uses and applications of the subject invention will, however, become apparent to those skilled in the art after considering this specification and the accompanying drawings which disclose the preferred embodiments thereof. All such changes, modifications, variations and other uses and applications which do not depart from the spirit and scope of the invention are deemed to be covered by the invention, which is to be limited only by the claims which follow.

What is claimed is:

1. Apparatus for geometric reshaping of a radiation beam, emitted by at least one radiation source, which propagates in a propagation direction along a z-direction and has a radiation cross section which, in one direction defined as an x-direction, extends perpendicular to the z-direction, and in a direction perpendicular to the x and z-directions, defined as a y-direction, exhibits a greater width with lower beam density, whereby x, y and z form a rectangular coordinate system, wherein the radiation beam is grouped in partial radiation components in the x-direction and the radiation components are re-oriented in relation to their beam cross sections, said apparatus comprising, in combination:
(a) mirror array arranged to intercept the radiation beam and including several reflective elements, each element having a pair of planar reflection surfaces which are aligned with respect to each other and form an opening angle of substantially 90° which is directed opposite to the propagation direction, wherein each part of the radiation is double-reflected in each instance on the reflection surfaces assigned in pairs, and is rotated by said opening angle, wherein the individual pairs of reflection surfaces form a line of intersection between them oriented substantially 45° with respect to the x-direction and substantially 90° with respect to the z-direction, thus forming a continuous w-shaped surface structure, and (b) a polarization splitter disposed in the radiation beam between the radiation source and the mirror array, wherein, viewed in the direction of radiation propagation, the radiation beam is first incident on the polarization splitter and, after retro-reflection from the pairs of reflection surfaces of the mirror array, is brought back to the polarization splitter with a rotated polarization direction and is there decoupled.

2. The apparatus according to claim 1, wherein the radiation components are grouped by the lines of intersection of immediately adjacent reflection surfaces of the adjacent pairs of reflection surfaces.

3. The apparatus according to claim 1, wherein the radiation beam is composed from the radiation components of several radiation sources, and is projected on pairs of reflection surfaces by means of a projection lens in such a way that a pair of reflection surfaces is assigned to each radiation component.

4. The apparatus according to claim 1, further comprising a lens assigned to each radiation component reflected by a pair of reflection surfaces, which enlarges the dimension of the beam cross section in the y-direction, and reduces beam divergence in the y-direction.

\* \* \* \* \*